United States Patent
Yeo

(10) Patent No.: US 8,193,708 B2
(45) Date of Patent: Jun. 5, 2012

(54) PLASMA DISPLAY DEVICE

(75) Inventor: Jae-Young Yeo, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 523 days.

(21) Appl. No.: 12/399,781

(22) Filed: Mar. 6, 2009

(65) Prior Publication Data

US 2009/0231236 A1 Sep. 17, 2009

(30) Foreign Application Priority Data

Mar. 13, 2008 (KR) .................... 10-2008-0023376

(51) Int. Cl.
*H01J 17/49* (2006.01)

(52) U.S. Cl. ........................... 313/583; 313/587

(58) Field of Classification Search ........... 313/582–587
See application file for complete search history.

(56) References Cited

U.S. PATENT DOCUMENTS

| | | | | |
|---|---|---|---|---|
| 5,777,610 | A * | 7/1998 | Sugimoto et al. | 345/206 |
| 6,166,711 | A | 12/2000 | Odake | |
| 6,472,820 | B1 * | 10/2002 | Mo | 313/581 |
| 2005/0190175 | A1 * | 9/2005 | Kim et al. | 345/204 |
| 2006/0103595 | A1 * | 5/2006 | Kim et al. | 345/60 |
| 2008/0116797 | A1 * | 5/2008 | Hong et al. | 313/582 |
| 2008/0116801 | A1 * | 5/2008 | Hong et al. | 313/583 |
| 2008/0165483 | A1 * | 7/2008 | Tanaka et al. | 361/681 |
| 2009/0219227 | A1 * | 9/2009 | Takayama | 345/60 |

FOREIGN PATENT DOCUMENTS

| | | |
|---|---|---|
| EP | 1 387 385 A1 | 2/2004 |
| JP | 10-283940 | 10/1998 |
| KR | 2003-0033565 | 5/2003 |
| KR | 10-2006-0019820 | 3/2006 |

OTHER PUBLICATIONS

SIPO Office action dated Feb. 23, 2011, for corresponding Chinese Patent application 200910126535.2, with English translation, 8 pages.
European Search Report dated Jul. 7, 2010, for corresponding European Patent application 09290178.4, noting listed references in this IDS.
SIPO Office action dated Feb. 1, 2012, for corresponding Chinese Patent application 200910126535.2, with English translation, 8 pages.

* cited by examiner

*Primary Examiner* — Bumsuk Won
(74) *Attorney, Agent, or Firm* — Christie, Parker & Hale, LLP

(57) ABSTRACT

A plasma display device includes a chassis base supporting a plasma display panel. A printed circuit board having a plurality of scan integrated circuits is mounted on the chassis base. Lines of a first flexible printed circuit and of a second flexible printed circuit connect the scan electrodes to the scan integrated circuits. The lines of each of the first and second flexible printed circuits include a first outer line and a second outer line at respective sides of each of the first and second flexible printed circuits, at least one inner line between the first outer line and the second outer line, and at least one dummy line at an outer side of the first outer line. The second outer line of the first flexible printed circuit is connected to the dummy line of the second flexible printed circuit.

5 Claims, 5 Drawing Sheets

PLASMA DISPLAY DEVICE

CROSS-REFERENCE TO RELATED APPLICATION

This application claims priority to and the benefit of Korean Patent Application No. 10-2008-0023376 filed in the Korean Intellectual Property Office on Mar. 13, 2008, the entire content of which is incorporated herein by reference.

BACKGROUND OF THE INVENTION (a) Field of the Invention

The present invention relates to plasma display devices, and more particularly, to a plasma display device configured to prevent horizontal image streaking or a horizontal luminance difference induced by a luminance difference between scan electrodes.

(b) Description of the Related Art

Generally, a plasma display device includes a plasma display panel (PDP) for displaying an image, a chassis base for supporting the PDP, and a plurality of printed circuit boards (PCBs) mounted on the chassis base and connected to the PDP.

The PDP generates plasma using gas discharge, excites phosphors using vacuum ultra-violet rays emitted from the plasma, and realizes an image using red, green, and blue visible lights that are generated as the excited phosphors are stabilized.

In order to induce the gas discharge, the PDP includes address electrodes and display electrodes (e.g., sustain electrodes and scan electrodes). The address electrodes intersect the display electrodes at regions corresponding to discharge cells. The address electrodes, the sustain electrodes, and the scan electrodes are connected to the corresponding PCBs through flexible printed circuits (FPCs).

Typical PCBs include a sustain board for controlling the sustain electrodes, a scan board for controlling the scan electrodes, and an address buffer board for controlling the address electrodes. The scan board is connected to the scan electrodes through a scan buffer board having scan integrated circuits (scan ICs) mounted thereon.

A plurality of FPCs connect the scan electrodes of the PDP to the scan buffer board. The scan electrodes are classified into a plurality of groups, and each of the plurality of FPCs is connected to each group of the scan electrodes, respectively.

Each of the FPCs includes two outermost lines, and inner lines disposed between the outermost lines. With reference to one FPC, each of the outermost lines has a first side to which no inner line is adjacent and a second side to which an inner line is adjacent. The inner lines have a first side to which an inner line or an outermost line is adjacent and a second side to which an inner line or an outermost line is adjacent.

Accordingly, each outermost line is influenced by a magnetic field induced from only one inner line. That is, the magnetic field permeating to one side has an effect on the outermost line. On the other hand, each inner line is influenced at both sides by the magnetic field induced from the inner lines, or the inner line and the outermost line. That is, the magnetic field has an effect on each of the inner lines from both sides thereof.

Thus, the voltage waveform influenced by the magnetic field permeating to one side is applied to each scan electrode connected to the outermost lines. In comparison, the voltage waveform influenced by the well-balanced magnetic field at both sides is applied to each scan electrode connected to the inner lines.

Thus, the scan electrodes connected to the outermost lines have high impedance and generate low luminance, as compared to the scan electrodes connected to the inner lines.

With regard to two FPCs adjacent to each other, scan electrodes connected to outermost lines of first and second FPCs continuously generate relatively low luminance, as compared to the scan electrodes connected to the inner lines.

In the whole plasma display panel, portions between two FPCs have relatively low luminance and the portions are regularly formed. This is called horizontal image streaking (or horizontal luminance difference) of the PDP.

SUMMARY OF THE INVENTION

In accordance with the present invention a plasma display device is provided which prevents a luminance difference between scan electrodes by minimizing differences in magnetic fields and impedance.

In addition, a plasma display device is provided that is configured to prevent horizontal image streaking, which is induced by a luminance difference, by minimizing differences in magnetic fields and impedance between scan electrodes of outer lines and scan electrodes of inner lines.

An exemplary embodiment of the present invention provides a plasma display device including a PDP, a chassis base, at least one printed circuit board, a first FPC, and a second FPC. The PDP includes sustain electrodes, scan electrodes, and address electrodes corresponding to a plurality of discharge cells to selectively drive at least one of the plurality of discharge cells. The chassis base supports the PDP. The printed circuit board is mounted on the chassis base. The printed circuit board includes a plurality of scan ICs. The first FPC and the second FPC include lines connecting the scan electrodes to the scan ICs. The lines of each of the first and second FPCs include a first outer line and a second outer line disposed at both sides of each of the first and second FPCs. The at least one inner line is disposed between the first outer line and the second outer line. The at least one dummy line is disposed at an outer side of the first outer line. The second outer line of the first FPC is connected to the dummy line of the second FPC.

The second outer line of the first FPC and the dummy line of the second FPC may be connected to each other at the PDP. The second outer line of the first FPC and the dummy line of the second FPC may be connected to each other at the printed circuit board.

The PDP may include a display area displaying an image and a non-display area disposed at a periphery of the display area. The non-display area may include a terminal region where the first and second FPCs are connected to the display area and an interconnection region. An interconnection region may include an interconnection portion where the second outer line of the first FPC and the dummy line of the second FPC are together and are connected to one scan electrode.

The printed circuit board may be a scan buffer board connected to the scan electrodes. The scan buffer board may include at least one connecting line connecting the second outer line of the first FPC to the dummy line of the second FPC.

Another embodiment of the present invention provides a plasma display device including a PDP including scan electrodes, a scan buffer board mounting a plurality of scan ICs, and a plurality of FPCs including lines electrically connecting the scan electrodes to the scan ICs. A pair of outer lines of the lines facing each other and formed on the FPCs adjacent to each other are connected to each other and to one scan electrode of the scan electrodes.

The pair of outer lines may be connected to each other at the PDP. The pair of outer lines may be connected to each other at the scan buffer board.

According to an exemplary embodiment of the present invention, a pair of outer lines of the lines facing each other and formed on the FPCs adjacent to each other are connected to each other and to one scan electrode of the scan electrodes. Thus, the difference in the magnetic field between the scan electrodes can be minimized.

Accordingly, the difference in impedance between the scan electrodes is minimized, thereby reducing the luminance difference between the scan electrodes. As a result, the horizontal image streaking of the PDP, which may be generated in correspondence with the FPC, can be prevented.

DETAILED DESCRIPTION OF THE EMBODIMENTS

Figure 1:
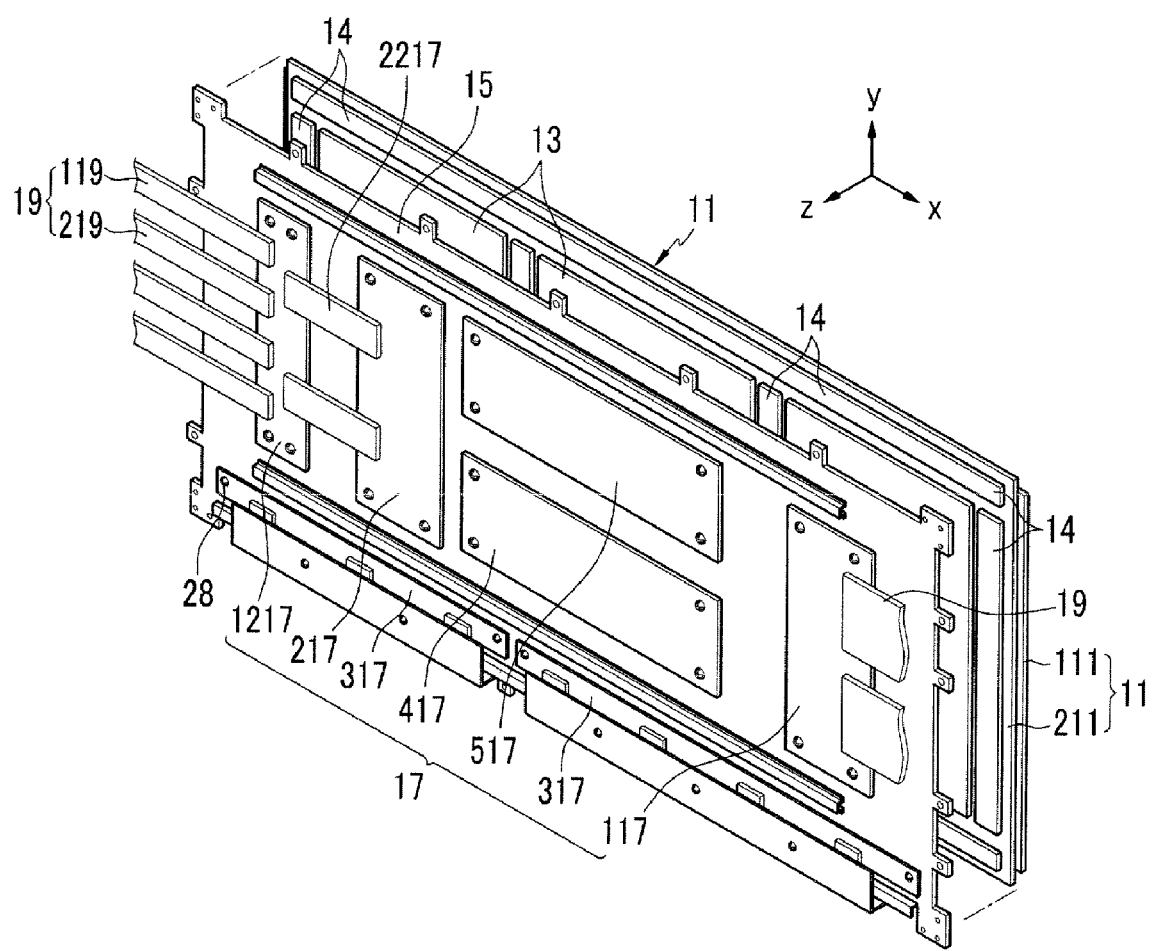
FIG. 1 is an exploded perspective view of a plasma display device according to an exemplary embodiment of the present invention.

Referring to FIG. 1, a plasma display device includes a plasma display panel (PDP) 11 displaying an image, a plurality of heat dissipation sheets 13, a chassis base 15, a plurality of PCBs 17, and a plurality of FPCs 19.

Exemplary embodiments of the present disclosure relate to a coupling structure between the PDP 11 and other components. Therefore, a detailed description of the internal operation of the PDP is not needed and will be omitted herein.

Figure 2:
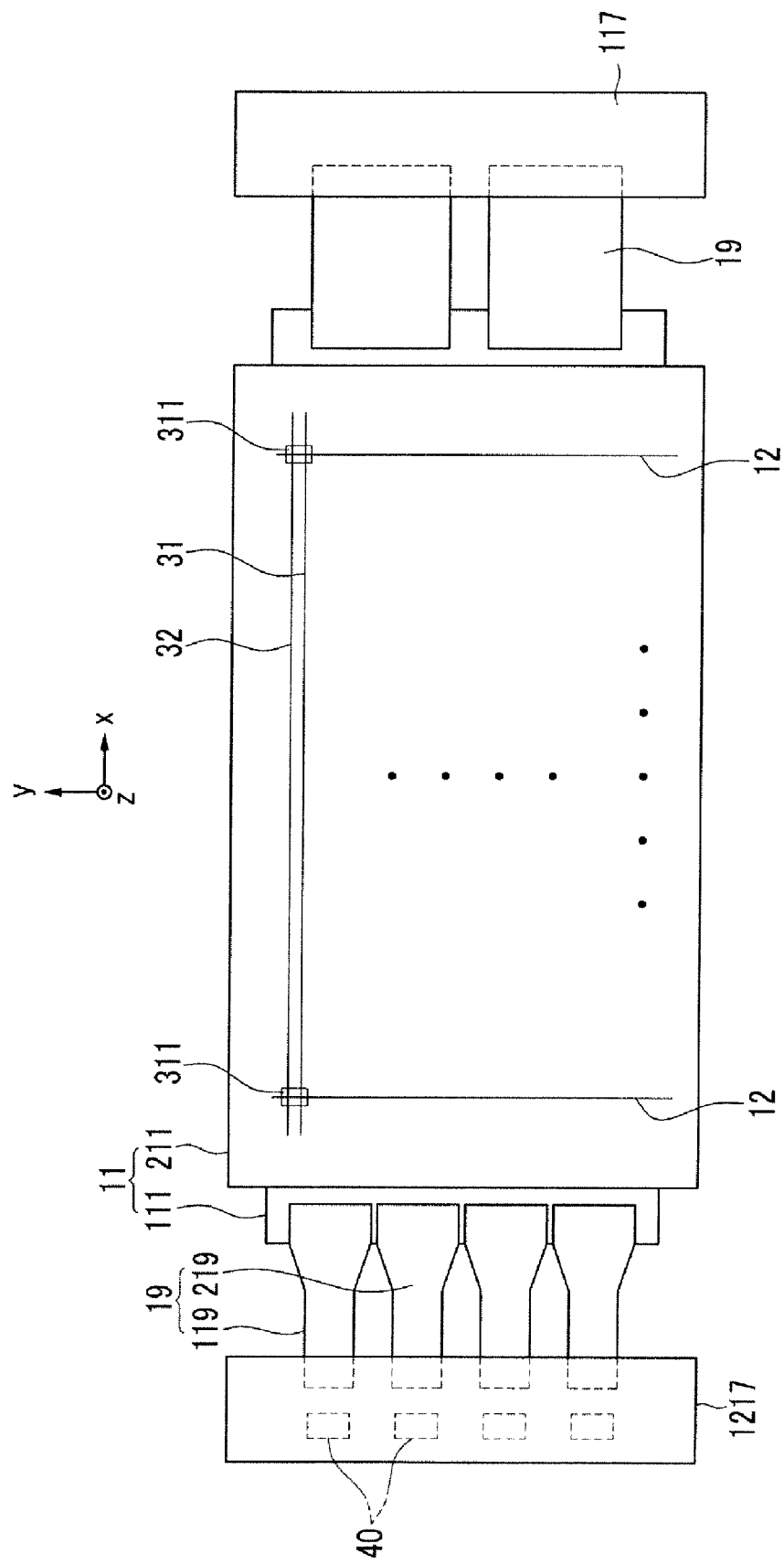
FIG. 2 is a front view showing a PDP, a sustain board, and a scan buffer board of FIG. 1 in the state in which they are connected to each other through FPCs and unfolded.
Figure 3:
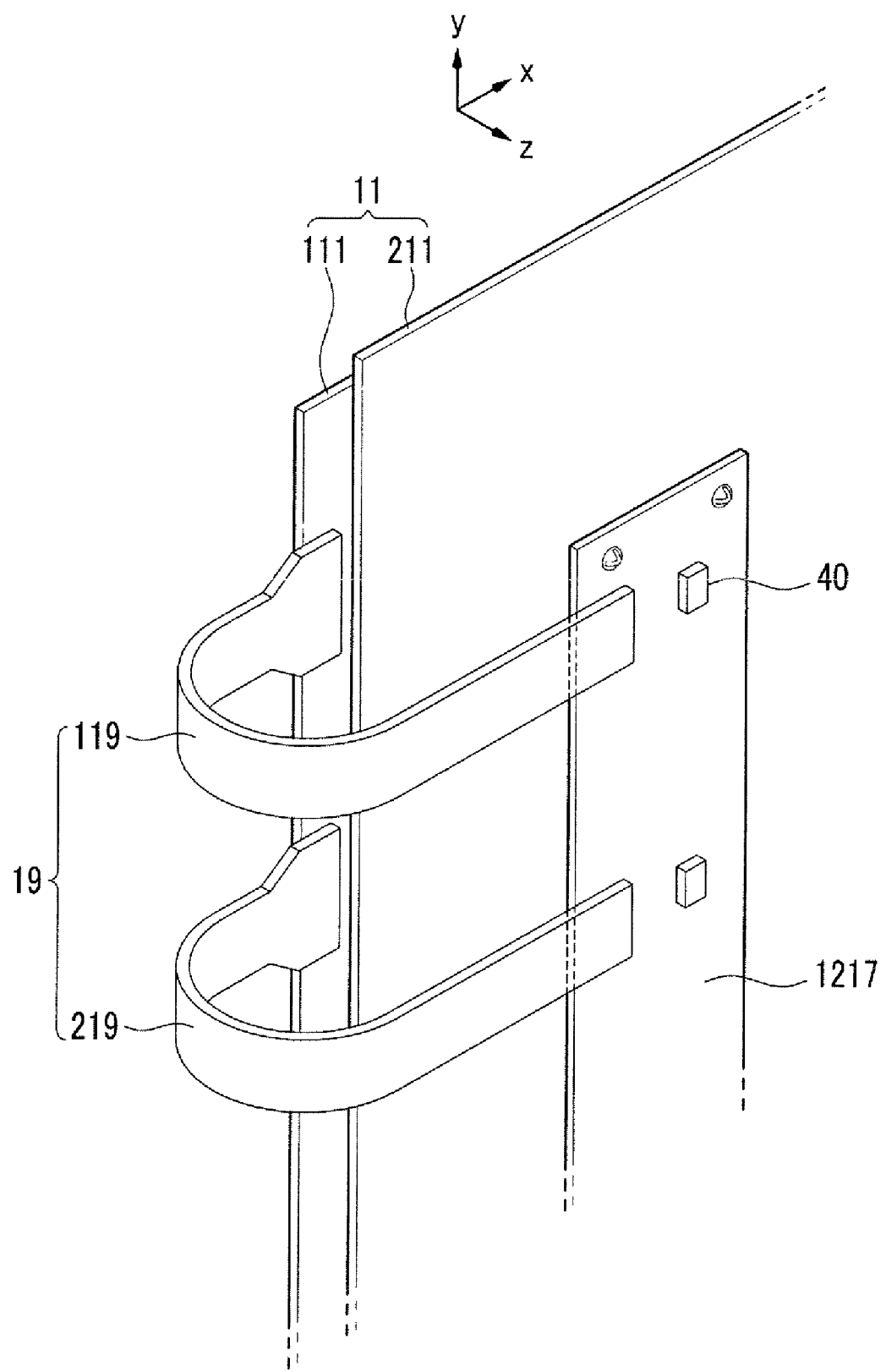
FIG. 3 is a partial perspective view showing the PDP and the scan buffer board of FIG. 1 connected to each other through the FPCs and folded.

Referring now to FIGS. 1, 2 and 3, the PDP 11 includes a front substrate 111, a rear substrate 211, sustain electrodes 31, scan electrodes 32, and address electrodes 12. The sustain, scan, and address electrodes 31, 32, 12 are arranged to induce gas discharge in discharge cells 311 formed between the front and rear substrates 111, 211.

The address electrodes 12 intersect the scan electrodes 32 at regions corresponding to discharge cells 311 in order to select discharge cells that will be turned on. The sustain electrodes 31 and the scan electrodes 32 are arranged in parallel with each other to realize an image at the selected discharge cells 311. The address electrodes 12 extend in a y-axis direction and the sustain and scan electrodes 31, 32 extend in an x-axis direction.

Referring again to FIG. 1, the heat dissipation sheets 13 are provided on a rear surface of the PDP 11 to dissipate heat generated by the PDP 11 in a planar direction of the PDP 11.

The chassis base 15 is adhered to the rear surface of the PDP 11 by a double-sided adhesive tape 14 with the heat dissipation sheets 13 interposed between them.

The PCBs 17 are mounted on a rear surface of the chassis base 15 and are electrically connected to the PDP 11 to drive the PDP 11. The PCBs 17 are disposed on bosses (not shown) formed on the chassis base 15 and are fixed to the bosses by setscrews 28. The PCBs 17 have different functions for driving the PDP 11.

For example, the PCBs 17 include a sustain board 117 for controlling the sustain electrodes 31, a scan board 217 for controlling the scan electrodes 32, and an address buffer board 317 for controlling the address electrodes 12.

The PCBs 17 further include an image processing/control board 417 for receiving external video signals, generating control signals required for driving the address electrodes 12 and control signals required for driving the sustain and scan electrodes 31, 32, and applying the control signals to the corresponding PCBs, and a power supply board 517 for supplying electrical power required for driving the boards 117, 217, 317, 417.

The FPCs 19 include FPCs for connecting the sustain board 117 to the sustain electrodes 31, FPCs for connecting the scan board 217 to the scan electrodes 32, and FPCs for connecting the address buffer board 317 to the address electrodes 12. In the present exemplary embodiment, the FPCs 19 for connecting the scan board 217 to the scan electrodes 32 will be exemplarily described.

The scan board 217 and a scan buffer board 1217 are connected to each other through FPCs 2217. The scan buffer board 1217 mounts scan ICs 40 to control the scan electrodes 32. The scan ICs 40 generate a voltage waveform for controlling the scan electrodes 32 in accordance with control signals from the scan board 217.

Each of the scan ICs 40 is connected to a respective plurality of scan electrodes 32. Thus, so as to connect the plurality of scan ICs 40 to a respective plurality of scan electrodes 32, a plurality of the FPCs 19 are provided, and each of the FPCs 19 are grouped with a scan IC 40 and with its corresponding scan electrodes 32.

Figure 4:
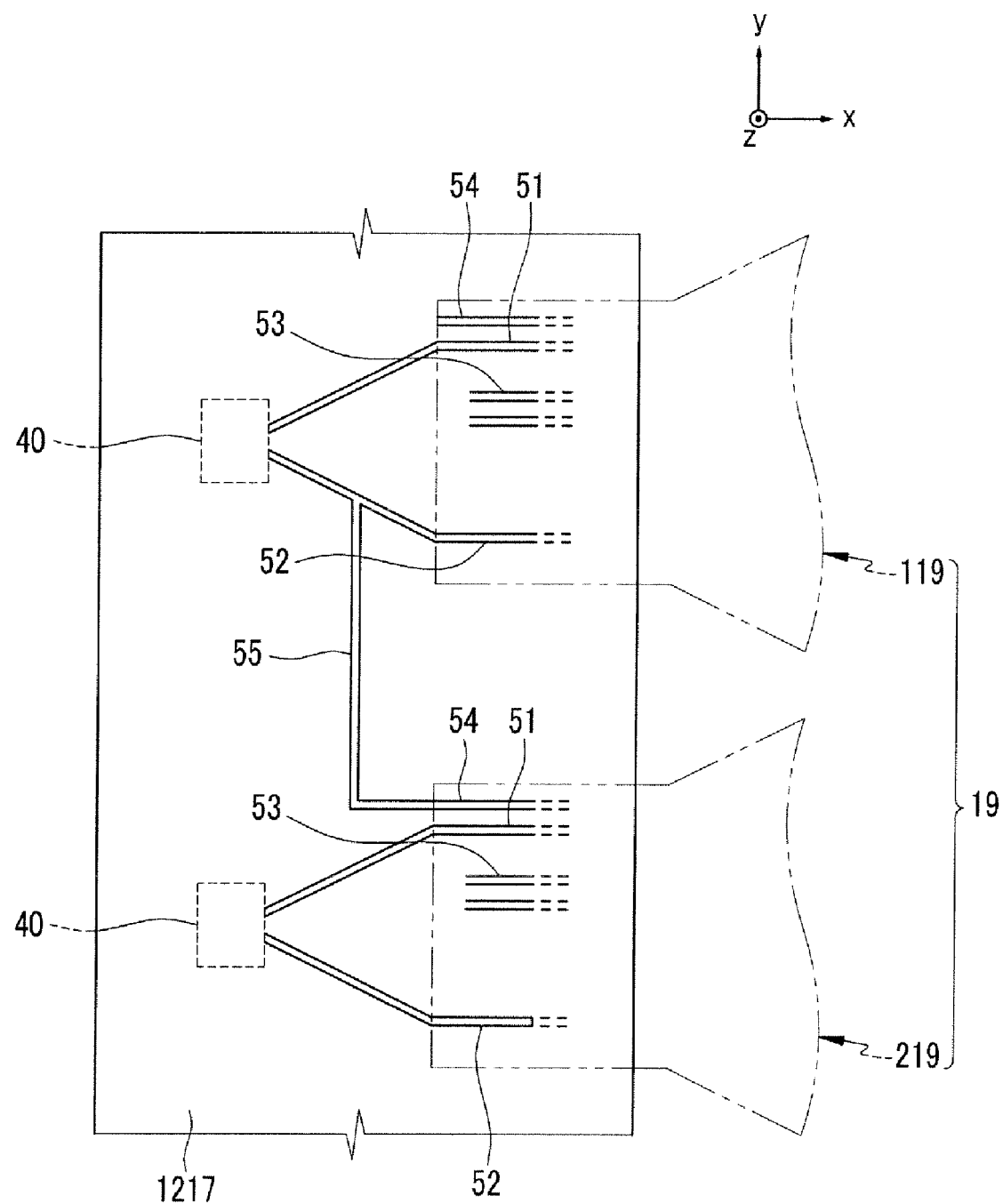
FIG. 4 is a detailed view showing a connection structure between the scan buffer board and the FPCs of FIG. 1.
Figure 5:
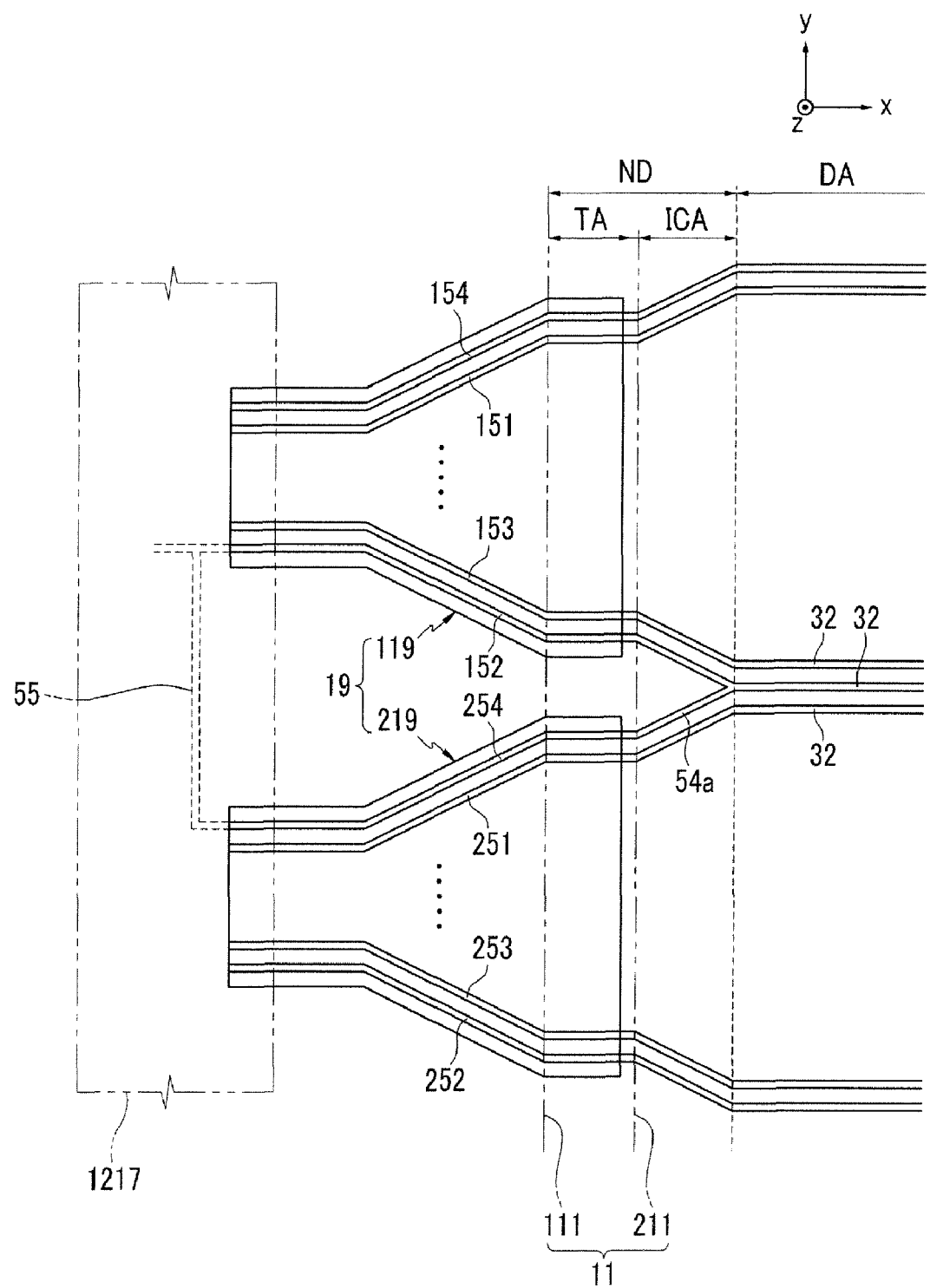
FIG. 5 is a detailed view showing a connection structure between the FPCs and scan electrodes of FIG. 1.

FIG. 4 is a detailed view showing a connection structure between the scan buffer board and the FPCs of FIG. 1, and FIG. 5 is a detailed view showing a connection structure between the FPCs and scan electrodes of FIG. 1.

Referring to FIG. 4, the FPCs 19 include a plurality of lines that apply the voltage waveform of the scan ICs 40 to the scan electrodes 32.

In the present exemplary embodiment, a pair of outer lines of the lines facing each other and formed on two FPCs 19 adjacent to each other are connected to each other and to one scan electrode 32 of the scan electrodes 32. Accordingly, the difference in the magnetic field between the scan electrodes 32 connected to the pair of outer lines of the two FPCs and the other scan electrodes 32 can be minimized.

The lines include first and second outer lines 51, 52 disposed at respective sides of each of the FPCs, at least one inner line 53 disposed between the first and second outer lines 51, 52, and at least one dummy line 54 disposed at an outer side of one of the first and second outer lines 51, 52.

The second outer line 52 of one FPC 19 is connected to the dummy line 54 of another FPC 19 adjacent to the one FPC 19, and the second outer line 52 and the dummy line 54 are connected one scan electrode 32. Thus, the difference in the magnetic field between the scan electrode 32 connected to the second outer line 52 and the dummy line 54 and the other scan electrodes 32 can be minimized.

For example, the second outer line 52 and the dummy line 54 are connected to each other at the scan buffer board 1217 (see FIG. 4), and/or a second outer line 152 and a dummy line 254 are connected to each other at the PDP 11 (see FIG. 5).

The second outer line 52 and the dummy line 54 may be connected to each other at one of the scan buffer board 1217 and the PDP 11. Selectively, the second outer line 52 and the dummy line 54 may be connected to each other at both of the scan buffer board 1217 and the PDP 11. In this case, the difference in the magnetic field between the scan electrode 32 can be further reduced.

In more detail, referring to FIG. 5, the scan buffer board 1217 further includes a connection line 55 connecting the second outer line 152 and the dummy line 254. An interconnection portion 54a where the dummy line 254 and the second outer line 152 are together to be connected to one scan electrode 32 is formed in the PDP 11.

In more detail, the PDP 11 includes a display area DA displaying an image and a non-display area ND formed at a periphery of the display area DA. The non-display area ND includes a terminal region TA where the FPCs 19 are connected to the display area DA and an interconnection region ICA.

More specifically, in the present exemplary embodiment, the FPCs 19 include a first FPC 119 and a second FPC 219 adjacent to each other. The lines include first lines formed on the first FPC 119 and second lines formed on the second FPC 219.

The first lines of the first FPC 119 include first and second outer lines 151, 152 disposed at respective sides of each of the first FPC 119, at least one inner line 153 disposed between the first and second outer lines 151, 152, and at least one dummy line 154 disposed beside an outer side of one of the first and second outer lines 151, 152. For example, the dummy line 154 of the first FPC 119 is disposed at the outer side of the first outer line 151 of the first FPC 119.

The second lines of the second FPC 219 include first and second outer lines 251, 252 disposed at respective sides of each of the second FPCs 219, at least one inner line 253 disposed between the first and second outer lines 251, 252, and at least one dummy line 254 disposed beside an outer side of one of the first and second outer lines 251, 252. For example, the dummy line 254 of the second FPC 219 is disposed at the outer side of the first outer line 251 of the second FPC 219.

The second outer line 152 of the first FPC 119 and the dummy line 254 of the second FPC 219 are connected to each other and to one scan electrode 32 of the scan electrodes 32. Thus, the difference in the magnetic field between the scan electrodes 32 can be minimized. The difference in the magnetic field was generated between the scan electrode 32 connected to the first FPC through the second outer line 152 of the first FPC 119 and the dummy line 254 of the second FPC 219, and the other scan electrodes 32 connected to the inner lines 153, 253 of the first and second FPCs 119, 219 and the first outer line 251 of the second FPC 219.

In the present exemplary embodiment, the second outer line 152 of the first FPC 119 and the dummy line 254 of the second FPC 219 are connected to each other through the connection line 55 in the scan buffer board 1217 and through the interconnection portion 54a in the PDP 11. Therefore, the difference in the magnetic field, which is generated between the scan electrode 32 connected through the connection line 55 and the interconnection portion 54a and the other scan electrodes, can be reduced.

That is, the difference in impedance between the scan electrodes 32 connected to both of the first and second FPCs 119, 219 and the scan electrodes 32 connected to one of the first and second FPCs 119, 219 can be decreased. As a result, the horizontal image streaking of the PDP, which is generated to correspond to the FPC, can be prevented.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device comprising:
   a plasma display panel comprising sustain electrodes, scan electrodes, and address electrodes corresponding to a plurality of discharge cells for selectively driving at least one of the plurality of discharge cells;
   a chassis base supporting the plasma display panel;
   at least one printed circuit board mounted on the chassis base, the at least one printed circuit board comprising a plurality of scan integrated circuits; and
   a first flexible printed circuit and a second flexible printed circuit including lines connecting the scan electrodes to the scan integrated circuits,
   wherein the lines of each of the first flexible printed circuit and the second flexible printed circuit comprise:
      a first outer line and a second outer line at respective sides of each of the first flexible printed circuit and the second flexible printed circuit;
      at least one inner line between the first outer line and the second outer line; and
      at least one dummy line at an outer side of the first outer line, and
   wherein the second outer line of the first flexible printed circuit is connected to the at least one dummy line of the second flexible printed circuit, and
   wherein the second outer line of the first flexible printed circuit and the at least one dummy line of the second flexible printed circuit are connected to each other at the plasma display panel and at the printed circuit board.

2. The plasma display device of claim 1, wherein the plasma display panel comprises:
   a display area for displaying an image, and
   a non-display area at a periphery of the display area, the non-display area comprising:
      a terminal region where the first flexible printed circuit and the second flexible printed circuit are connected to the display area, and
      an interconnection region, the interconnection region comprising an interconnection portion where the second outer line of the first flexible printed circuit and the at least one dummy line of the second flexible printed circuit are connected together and to one of the scan electrodes.

3. The plasma display device of claim 1, wherein the printed circuit board comprises a scan buffer board connected to the scan electrodes.

4. The plasma display device of claim 3, wherein the scan buffer board comprises at least one connecting line connecting the second outer line of the first flexible printed circuit to the at least one dummy line of the second flexible printed circuit.

5. A plasma display device comprising:
   a plasma display panel comprising scan electrodes;
   a scan buffer board for mounting a plurality of scan integrated circuits; and
   a plurality of flexible printed circuits comprising lines electrically connecting the scan electrodes to the scan integrated circuits,
   wherein a pair of outer lines of the lines face each other, are on the flexible printed circuits adjacent to each other and are connected to each other and to one of the scan electrodes, and
   wherein the pair of outer lines are connected to each other at the plasma display panel and at the scan buffer board.

* * * * *